United States Patent [19]

Meder

[11] Patent Number: 5,212,017

[45] Date of Patent: May 18, 1993

[54] AMINOPROPYLTRIMETHOXY SILANE PRIMER COMPOSITION AND COATED ARTICLES MADE THEREWITH

[75] Inventor: Martin G. Meder, Hightstown, N.J.

[73] Assignee: General Electric Company, East Windsor, N.J.

[21] Appl. No.: 627,458

[22] Filed: Dec. 14, 1990

[51] Int. Cl.⁵ .............................................. B32B 9/04
[52] U.S. Cl. .................................... 428/447; 427/322; 427/387; 428/448; 428/473.5; 556/413
[58] Field of Search ................ 427/387, 322; 428/447, 428/448, 473.5; 556/413

[56] References Cited

U.S. PATENT DOCUMENTS

| | | | |
|---|---|---|---|
| 2,832,754 | 4/1958 | Kenmore et al. | 528/38 |
| 3,022,196 | 2/1962 | Jenkins et al. | 156/329 |
| 3,127,363 | 3/1964 | Nitzsche et al. | 106/38.25 |
| 3,445,326 | 5/1969 | Hurst | 156/329 |
| 3,477,901 | 11/1969 | Keil | 156/329 |
| 3,650,808 | 3/1972 | Gagnan | 427/387 X |
| 3,665,027 | 5/1972 | Reichel | 260/448.8 |
| 3,864,373 | 2/1975 | Seiler et al. | 106/287 |
| 3,888,815 | 6/1975 | Bessmer et al. | 260/37 SB |
| 4,045,460 | 8/1977 | Kleinstuck | 260/448.8 |
| 4,052,524 | 10/1977 | Harakas et al. | 156/329 |
| 4,233,428 | 11/1980 | Endo | 525/507 |
| 4,234,502 | 11/1980 | Kappler et al. | 556/413 |
| 4,234,503 | 11/1980 | Kappler et al. | 556/413 |
| 4,293,597 | 10/1981 | Bessmer et al. | 427/186 |
| 4,401,500 | 8/1983 | Hamada et al. | 156/329 |
| 4,481,364 | 11/1984 | Chu et al. | 556/413 |
| 4,542,257 | 9/1985 | Fraser et al. | 156/297 X |
| 4,543,404 | 9/1985 | Sugano et al. | 528/26 |
| 4,556,722 | 12/1985 | Quirk et al. | 556/413 |
| 4,592,925 | 6/1986 | DuPont et al. | 427/74 |
| 4,727,168 | 2/1988 | Yoshino et al. | 556/408 |
| 4,921,880 | 5/1990 | Lee et al. | 522/12 |
| 4,921,988 | 5/1990 | Takatsuna et al. | 556/413 |
| 4,927,949 | 5/1990 | Kabeta et al. | 556/413 |
| 4,927,953 | 5/1990 | Takatsuna et al. | 556/413 |

OTHER PUBLICATIONS

"Silane Coupling Agents"—E. P. Plueddemann, Plenum Press, 1982, pp. 42; 128 and 134–136.

*Primary Examiner*—Michael Lusignan

[57] ABSTRACT

A primer composition of gamma-aminopropyltrimethoxysilane dissolved in an aprotic solvent having a solubility parameter of about 10.8 $(cal/cm^3)^{\frac{1}{2}}$, for example, N,N'-dimethylacetamide, useful for bonding coating compositions to substrates. A superior bond is formed between a condensation cure silicone rubber and a polyimide film substrate when a primer composition of gamma-aminopropyltrimethoxysilane dissolved in N,N'-dimethylacetamide is first applied to the surface of the polyimide film and dried and cured thereon.

25 Claims, No Drawings

AMINOPROPYLTRIMETHOXY SILANE PRIMER COMPOSITION AND COATED ARTICLES MADE THEREWITH

The Government has rights in this invention pursuant to Contract No. F04701-83-C-0030 awarded by the United States Air Force.

BACKGROUND OF THE INVENTION

This invention relates to a primer composition, and more particularly, to a primer composition of gamma-aminopropyltrimethoxy silane and to the use of a primer composition for promoting adhesion of condensation cure silicones in the cured state to substrates.

Silane coupling agents have been used in the prior art to promote the adhesion of various silicone materials and various organic adhesives and polymers, such as epoxy resins, polyurethane resins, and the like to a variety of substrates as explained in U.S. Pat. Nos. 4,921,880 and 4,927,953 which are incorporated by reference herein in their entirety. In U.S. Pat. No. 4,921,880, it is indicated that even though silanes and certain other silicon containing compounds function as coupling agents and adhesion promoters, they do not function equally in all situations, and the usefulness thereof depends on the type of substrate, the type of material being bonded to the substrate and the conditions under which the adhesive bond is to perform. According to U.S. Pat. No. 4,921,880, the silane coupling agents are those which have organofunctional groups bonded to the silicon atom, such as a vinyl functional, vinyl or methacrylate groups, as well as hydrolyzable groups, such as methoxy or ethoxy groups bonded to the silicon atom. In U.S. Pat. No. 4,927,953, gamma-aminopropylalkoxy silanes are described as silane coupling agents which increase the mechanical strength of the organic polymer bonded with an inorganic material.

In coupling the inorganic materials of substrates to organic adhesives or coating compositions with alkoxysilylpropylamine coupling agents, it appears that the alkoxy groups on the silane of the alkoxysilylpropylamines condense with pendant hydroxy groups on the surface of the inorganic material (and with the hydroxy groups in water from atmospheric moisture), and the reactive aminopropyl group of the molecule is presented to the organic adhesive or coating material, such as the epoxy, where it is available for covalent bonding, and forms a covalent bond therewith. Theory of the formation of silane bonds with polymers is described at pages 42 and 128 of the book entitled "Silane Coupling Agents" published by Plenum Press in 1982. At pages 134–136 of the book entitled "Silane Coupling Agents", there is a discussion of the silane bonds formed with polymers and of bonding through interpenetrating networks and the strengthening of boundary layers. It is indicated that a major function of adhesion promoters is to strengthen the boundary layer whether the adhesion promoter is applied as a primer or used as an integral additive.

In U.S. Pat. No. 2,832,754, trialkoxysilylpropylamines are proposed as a size or finish for fibrous glass materials prior to the preparation of reinforced plastics, and according to U.S. Pat. No. 2,832,754, laminates prepared from reinforced plastics having fibrous glass materials treated with trialkoxysilylpropylamines have a superior glass to resin bond when used in such thermosetting resins as aldehyde condensation resins, epoxy resins and urethane resins. According to U.S. Pat. No. 2,832,274, which is incorporated by reference herein in its entirety, because the trialkoxysilylpropylamines form stable solutions with aqueous organic admixtures or with water, they can be used to size or finish fibrous materials without employing anhydrous organic solvents.

Aminopropyltrialkoxy silanes have been used alone and in combination with various other silanes as priming agents in the prior art where they have been applied with various organic solvents. In U.S. Pat. No. 3,022,196, which is incorporated herein by reference in its entirety, aminopropyl silanes containing three —OR groups (alkoxy groups) with aminopropyltriethoxysilane being the preferred silane, are mixed with alkyltrialkoxy silanes and applied to a solid body when dissolved in any solvent for the components which solvent is also miscible with water, for example, alcohols, glycols, ketones, glycol ethers, and the like. The priming agents of U.S. Pat. No. 3,022,196 may be used to bond silicone rubber to a wide variety of solid bodies of the type used in making structural fabrications including metal, ceramic, glass, wood, resins, resin-bonded bodies, rubber, hydraulic cement, textiles containing synthetic organic fibers and the like. In U.S. Pat. No. 3,445,326, which is incorporated herein by reference in its entirety, amino-substituted silanes, such as gamma-aminopropyltriethoxysilane, is applied to a thin, flexible, non-porous substrate or structure, such as aluminum foil or flexible plastic film, and dried, prior to applying a thin film of non-porous coating material, such as polypropylene or polyethylene film, thereon. Non-porous films suggested as substrates in U.S Pat. No. 3,445,326 include Mylar ®, saran-coated cellophane, nitrocellulose-coated cellophane and cellophane, and the primers may be applied thereto from solution in any of many organic solvents, including hydrocarbon solvents, or in aqueous solution or aqueous dispersion. In U.S. Pat. No. 4,233,428, primer compositions containing gamma-aminopropyltrimethoxylsilane are applied to porous substrates, e.g., mortar and concrete, prior to applying silicone rubber curable at room temperature, thereto.

In U.S. Pat. No. 3,477,901, which is incorporated by reference herein in its entirety, silanes having a general formula which includes aminopropyltrimethoxysilane, mixed with monocarboxylic acids o r silanes which include alkyltrialkoxy silanes, are used to adhere a polyolefin to a substrate when in a liquid form including a solvent solution. In U.S. Pat. No. 3,477,901, any solvent can be employed that has no deleterious effect on the substrate or composition, including such solvents as methyl alcohol, ethyl alcohol, propyl alcohol, hexane, heptane, naphtha mineral spirits, Stoddard solvent, toluene, perchloroethylene and water. In U.S. Pat. No. 3,665,027, which is incorporated by reference herein in its entirety and which relates to a process for preparing gamma-aminopropylalkoxysilanes, silanes are used in the surface treatment of textiles, leather, ceramics and glass for corrosion protection of metals, as primer and adhesive, as well as for modifying synthetics.

Various methods of preparing aminopropyltrialkoxysilanes, including gamma-aminopropyltrimethoxysilane, are described in U.S. Pat. Nos. 4,045,460; 4,481,364; 4,556,722; 4,921,988 and 4,927,949, all of which are incorporated by reference herein in their entirety. In general, these references teach that the aminopropyltrialkoxysilanes are used as adhesion promoters or as coupling agents for various materials including inorganic materials, such as glass fibers, and organic polymers, such as vinyl plastisols, polyurethane elastomers, epoxy- and acrylic-based inks, and the like. In U.S. Pat. No. 4,927,949, the use of a solvent for the preparation of the aminoalkylalkoxysilane is not particularly required, but a solvent may be used to increase the solubility of the special rhodium catalyst or to help control the reaction temperature. Examples of such a solvent in U.S. Pat. No. 4,927,949 include hydrocarbon-type solvents, such as toluene, xylene, cyclohexane, and the like; halogenated hydrocarbon-type solvents, such as chloroform, carbon tetrachloride, and the like; ether-type solvents, such as ethylether and the like; ester-type solvents such as, ethyl acetate and the like; ketone-type solvents, such as acetone and the like; as well as aprotic polar solvents, such as dimethylformamide and dimethylacetamide. However, these solvents are used at the time of the reaction in the preparation of the aminoalkylalkoxysilane when it is prepared from the hydrosilylation of an allylamine with an alkoxyhydrosilane in the presence of a rhodium complex catalyst having a heterocyclic compound containing nitrogen and/or sulfur atoms as a ligand, and they are not present in the final product.

In U.S. Pat. No. 4,052,524, which is incorporated by reference herein in its entirety, it is suggested that gamma-aminopropyltrimethoxysilane is used in water (an aqueous system) for steel to improve adhesive bonding of rubber to steel for steel belted tires. In U.S. Pat. Nos. 4,921,880; 4,921,988; 4,927,953, all of which are incorporated by reference herein in their entirety, silane coupling agents and their use to enhance the adhesion of a variety of organic and silicone compositions to substrates, are disclosed.

In many commercial methods of priming a surface, it is necessary to abrade the surface prior to application of the primer thereto. Abrasion of surfaces is labor intensive, and in most instances abrasion is unevenly applied to the surface. Abrasion of films, e.g., polyimide films which have a low propagation tear strength, often results in scratches on the film which can act as sites of tear initiation. In those cases when the film is loaded with (contains) carbon, abrasion of the surface will generate conductive particles on the surface. Furthermore, the black carbon particles will degrade the optical properties of white coating material (paint) applied to the abraded surface if the carbon particles are not fully cleaned from the surface. Accordingly, it is desirable to find alternatives to primer methods, systems and compositions which require abrasion of the surfaces prior to application of a primer thereto.

Although it is well-known in the prior art that the aminoalkylalkoxysilanes, in general, and that gamma-amino-propyltrimethoxysilane, specifically, can be used as an adhesion promoter when applied as a primer composition to both porous and non-porous substrates, it is desirable to improve such primer compositions. Furthermore, it is desirable to improve the adhesion of coating materials not only to abraded substrates, but also to unabraded substrates. It is especially desirable to improve the adhesion of coating compositions, for example, certain condensation curable, polymerizable organosiloxanes, to unabraded, non-porous resin substrates, for example, to polyimide film. It is also desirable to improve coated articles made from flexible or non-flexible, porous or non-porous substrates by improving the adhesion of the coating materials to the substrates.

SUMMARY OF THE INVENTION

In accordance with the present invention, it has been discovered that the adhesion of coatings to substrates is improved when a primer composition containing gamma-amino-propyltrimethoxysilane is applied to the substrate and dried prior to the application of the coating thereto. This is achieved by providing a primer composition comprising gamma-aminopropyltrimethoxysilane dissolved in N,N'-dimethylacetamide (DMA).

It has been found that a composition of gamma-aminopropyltrimethoxysilane dissolved in N,N'-dimethylacetamide, when used as a primer, enhances the bonding of coating material to substrates without the need for abrasion of the surface of the substrate, chemical etching of the substrate or plasma etching of the substrate. It has been found that the primer composition of the present invention provides excellent adhesion promotion even on polyimide film having a glossy, non-porous surface without the need for abrasion or etching of the surface. Thus, the primer composition of the present invention overcomes the disadvantages of the prior art primer compositions, systems and methods which require abrasion of the surface to be primed.

In accordance with the present invention, there is also provided a method for priming a surface to improve its bonding to a condensation cure silicone in the cured state, comprising wetting the surface with a solution of gamma-aminopropyltrimethoxysilane in N,N'-dimethylacetamide, drying the surface to evaporate the N,N'-dimethylacetamide and curing the gamma-aminopropyltrimethoxysilane. In accordance with the present invention, there is also provided an article comprising a resin substrate and a gamma-aminopropyltrimethoxysilane primer, the gamma-aminopropyltrimethoxysilane having been applied to the substrate by wetting the substrate with a solution of gamma-aminopropyltrimethoxysilane in N,N'-dimethylacetamide, drying the substrate to evaporate or remove the solvent and curing the gamma-aminopropyltrimethoxysilane.

It has been found, in accordance with the present invention, that the only primer compositions having improved adhesion promotion are those wherein the aminoalkylalkoxysilane is gamma-aminopropyltrimethoxysilane, and the gamma-aminopropyltrimethoxysilane must be dissolved in an organic aprotic solvent having a solubility parameter of about 10.8 $(cal/cm^3)^{\frac{1}{2}}$. The preferred aprotic solvent which can be used to dissolve the gamma-aminopropyltrimethoxysilane, is N,N'-dimethylacetamide which has a solubility parameter of 10.8 $(cal/cm^3)^{\frac{1}{2}}$. The aprotic solvent used in the present invention must not be a solvent for the resin substrate to which the primer composition is applied, and it must be inert, i.e., non-reactive, with the gamma-aminopropyltrimethoxysilane. It is the specific and unique combination of gamma-aminopropyltrimethoxysilane dissolved in N,N'-dimethylacetamide which provides the exceptional adhesion of coating material to unabraded resin substrates in the present invention. None of the other silanes having similar organofunctional groups bonded to the silicon atom when used in primer compositions, produced the superior bonding characteristics found with the silane/solvent combination of the present invention. Even gamma-aminopropylalkoxysilanes having almost identical hydrolyzable groups, i.e., ethoxy groups rather than methoxy groups, did not produce the superior bonding when used in a primer composition. It was also surprising that gamma- aminopropyltrimethoxysilane formed a superior primer composition over the diamino silane, i.e., over N-2-aminoethyl-3-aminopropyltrimethoxysilane, which is capable of greater hydrogen bonding per molecule than gamma-aminopropyltrimethoxysilane. Furthermore, none of the solvents similar to N,N'-dimethylacetamide (DMA) when used in primer compositions, produced the superior bonding characteristics found with the silane/solvent combination of the present invention. Even an aprotic solvent similar to DMA, namely, dimethylformamide (DMF), did not result in a primer composition having the superior wetting found with the silane/solvent combination of the present invention.

Although there is no intention to be bound by any theory, it is believed that only N,N'-dimethylacetamide having a solubility parameter of 10.8 $(cal/cm^3)^{\frac{1}{2}}$ or an aprotic solvent having a solubility parameter of about 10.8 $(cal/cm^3)^{\frac{1}{2}}$, causes local reversible swelling of the surface of the polyimide substrate, and it is further believed that a semi-interpenetrating polymer of the polymeric substrate and condensed silane is formed that strongly retains a condensed silane film and allows the formation of adhesive bonds to the coating material, said bonds being strong enough to cause cohesive failure in the applied coating material rather than adhesive failure at the bondline. This swelling of the surface of the polymeric substrate allows more diffusion of the gamma-aminopropyltrimethoxysilane than would normally occur if there were no DMA or aprotic solvent having a solubility parameter of about 10.8 $(cal/cm^3)^{\frac{1}{2}}$, and since gamma-aminopropyltrimethoxysilane has the lowest molecular weight of any aminosilane, and since diffusion rate is proportional to (molecular weight)$^{-\frac{1}{2}}$, it promotes the exceptional adhesion discovered herein. It appears that the silane layer extends into the polymeric substrate, for example, into the surface of the glossy, non-porous polyimide.

In accordance with the present invention, the gamma-aminopropyltrimethoxysilane (AMMO) is applied to the polymer substrate, dried and cured thereon before the coating material is applied thereto. Thus, the AMMO bonds with the polymer substrate before it bonds with inorganic hydroxyl groups, alkoxy groups or similar groups on the coating material, for example, before it bonds with such groups on the silicone coating material. Thus, this bonding mechanism is believed to be the reverse of various prior art explanations of priming and bonding coating materials to inorganic substrates.

As used herein, the adhesion promoter, that is, gamma-aminopropyltrimethoxysilane, must be applied as a primer composition, namely, gamma-aminopropyltrimethoxysilane dissolved in N,N'-dimethylacetamide or an equivalent aprotic solvent blend.

DETAILED DESCRIPTION OF THE INVENTION

The gamma-aminopropyltrimethoxysilane coupling agent or adhesion promoter used in the primer composition of the present invention is well-known in the art, as evidenced by the references cited above which include conventional methods of preparing gamma-aminopropyltrimethoxysilane, for example, see U.S. Pat. Nos. 3,665,027 and 4,234,503, both of which are incorporated herein by reference in their entirety. In accordance with the present invention, it has been surprisingly found that gamma-aminopropyltrimethoxysilane is the only silane which demonstrated excellent adhesion promotion when it was applied as a primer composition to promote adhesion of a coating composition to a polymer or resin substrate, but only when the gamma-aminopropyltrimethoxysilane was dissolved in the aprotic solvent, N,N'-dimethylacetamide, referred to herein as dimethylacetamide, which has a solubility parameter of 10.8 $(cal/cm^3)^{\frac{1}{2}}$.

As discussed above, aprotic solvents having a solubility parameter of about 10.8 $(cal/cm^3)^{\frac{1}{2}}$, the solubility parameter of DMA being 10.8 $(cal/cm^3)^{\frac{1}{2}}$, can be used in the primer composition and methods of the present invention. Since maximum swelling and maximum wetting occur when the solubility parameter of a solvent matches that of a substrate, blends of aprotic solvents that perform as well as the DMA aprotic solvent, can be made and used in accordance with the present invention. For example, DMF which has a solubility parameter of 12.1 $(cal/cm^3)^{\frac{1}{2}}$, and which does not even wet the surface of resin substrates, can be mixed with diethylacetamide (DEA) having a solubility parameter of 9.9 $(cal/cm^3)^{\frac{1}{2}}$, to make a mixed aprotic solvent having solubility properties, i.e., a solubility parameter, equivalent to the solubility properties of DMA. Thus, a blend or mixture of two or more aprotic solvents, for example, DMF and DEA, having a solubility parameter of about 10.8 $(cal/cm^3)^{\frac{1}{2}}$ can be made by merely mixing a sufficient amount of DEA with DMF to lower the solubility parameter of the DMF to about 10.8 $(cal/cm^3)^{\frac{1}{2}}$. An aprotic solvent blend or mixture having a solubility parameter of about 10.8 $(cal/cm^3)^{\frac{1}{2}}$ substantially equivalent to that of DMA, can be easily made by one skilled in the art without undue experimentation. Any aprotic solvents, the combination of which forms a blend or mixture which does not dissolve or react with the substrate to which the primer composition is applied, which does not react with the gamma-aminopropyltrimethoxysilane, and which has a solubility parameter of about 10.8 $(cal/cm^3)^{\frac{1}{2}}$, may be used in the primer composition and method of priming of the present invention.

N,N'-dimethylacetamide or acetic acid dimethylamide is well-known in the art, and in its pure form has a density of about 0.936 at 25° C. and a boiling point of about 163°-165° C. at 760 mmHg. Dimethylacetamide is miscible with water and most organic solvents. Contrary to the teachings of the prior art, it (or aprotic solvent blends having a solubility parameter substantially equivalent to DMA) is the only solvent which may be used to prepare the primer composition for gamma-aminopropyltrimethoxysilane of the present invention. Accordingly, the primer compositions of the present invention are prepared by merely dissolving gamma-aminopropyltrimethoxysilane in dimethylacetamide.

Although the amount of dimethylacetamide to be used in the primer compositions of the present invention is not critical, if the concentration of gamma-aminopropyltrimethoxysilane is too high, that is, if there is insufficient dimethylacetamide solvent, the silane layer will be too thick and/or the solubility parameter will not be optimal since the gamma-aminopropyltrimethoxysilane is also a solvent which affects the solubility parameter of the DMA. If the amount of solvent is too high, that is, if the concentration of gamma-aminopropyltrimethoxysilane is too low, a good film necessary for promoting adhesion cannot be effectively formed on a substrate. These concentration parameters are easily determined by one skilled in the art. In preferred embodiments of the present invention, the concentration of gamma-aminopropyltrimethoxysilane in dimethylacetamide is about 0.1% to about 49% by weight, based on the total weight of the composition. In the most preferred embodiments of the present invention, the concentration of the gamma-aminopropyltrimethoxysilane and dimethylacetamide is about 1.0% to about 10% by weight, based on the total weight of the composition. The same preferred concentrations can be used with the aprotic solvent blends or mixtures discussed above.

Although it is preferred that the primer compositions of the present invention contain only dimethylacetamide as solvent, in certain instances, it is within the purview of one skilled in the art to add diluents thereto without causing any significant impact on the ability of the gamma-aminopropyltrimethoxysilane to improve bonding of coating materials or compositions to the surface of substrates. For example, diluents may be added to the dimethylacetamide solvent to increase the evaporation rate of the dimethylacetamide as long as the diluents do not interfere with the ability of the primer composition to improve adhesion promotion of the coating materials to the primed surfaces of substrates and/or with the solubility parameter of the DMA or other aprotic solvent blend. As long as the primer composition of gamma-aminopropyltrimethoxysilane dissolved in dimethylacetamide maintains its ability to improve the bonding of coating compositions to various substrates, especially polymer or resin substrates, and as long as there is no deleterious effect in the formation of the silane adhesion promoter film on the surface of the substrate or the improved bonding of the coating and substrate, a diluent or diluents may be added to the dimethylacetamide. Theoretically, as discussed above, the diluent must not interfere with the ability of the dimethylacetamide to cause local reversible swelling of the surface of the substrate or the formation of the semi-interpenetrating polymer of the polymeric substrate and condensed silane (gamma-aminopropyltrimethoxysilane) which strongly retains the condensed silane film and allows the formation of adhesive bonds to coating materials applied thereto that are strong enough to cause cohesive failure in the applied coating material rather than adhesive failure in the applied coating material at the bondline. When the substrate is a non-porous polyimide, the silane (gamma-aminopropyltrimethoxysilane) likely extends into the polyimide surface because of the swelling effect of the dimethylacetamide solvent. In any event, in accordance with the present invention, it has been unexpectedly found that the gamma-aminopropyltrimethoxysilane must be dissolved in dimethylacetamide in order to achieve the improved bonding of the coating materials to the polymeric or resin substrates. Naturally, one skilled in the art can use certain additives in the primer compositions of the present invention as long as the additives do not alter the solubility parameter of the solvent, adversely effect the substrate or effect any properties of the composition which promote adhesion of coating materials to the substrate. Additives which may be used in the primer composition of the present invention include dyes, fluorescent tracers, perfumes and the like.

In one aspect of the present invention, bonding of silicones in the cured state to substrates, especially non-porous polymeric or resin substrates, is improved when gamma-aminopropyltrimethoxysilane dissolved in dimethylacetamide is first applied to the polymeric or resin substrate as a primer, dried on the surface to evaporate dimethylacetamide and cured followed by coating the surface with the silicone. Accordingly, in accordance with the present invention, there is provided a method for priming a surface to improve its bonding to a silicone in the cured state, comprising wetting the surface with a solution of gamma-aminopropyltrimethoxysilane in aprotic solvent having a solubility parameter of about 10.8 $(cal/cm^3)^{\frac{1}{2}}$, e.g., dimethylacetamide, drying the surface and curing the gamma-aminopropyltrimethoxysilane. The surface of the substrate is wet by the primer composition by spraying, brushing, padding, dipping and the like, as well-known in the art. After the primer has been applied to the surface of the substrate, which surface is ultimately to be coated with a coating composition, the surface is dried to remove the volatile materials, for example, the solvent. Drying is not critical and may be carried out in any conventional manner, for example, by air at room temperature, by drying in an oven at a temperature which evaporates the volatile material without causing decomposition or volatilization of the silane as well-known in the art.

The drying of the primer composition is normally achieved at ambient temperature in only that amount of time required to remove or evaporate the solvent. However, once the solvent has evaporated, it is also necessary to cure the gamma-aminopropyltrimethoxysilane. Curing of the gamma-aminopropyltrimethoxysilane may be achieved in any manner which will form a crosslinked composition of the gamma-aminopropyltrimethoxysilane. Curing of the gamma-aminopropyltrimethoxysilane consists of hydrolysis of and condensation of the gamma-aminopropyltrimethoxysilane into a crosslinked composition. Thus, the gamma-aminopropyltrimethoxysilane on the substrate may be cured by subjecting it to moisture, e.g., atmospheric moisture at ambient or elevated temperatures for a sufficient time to hydrolyze and condense the gamma-aminopropyltrimethoxysilane into a crosslinked film on the substrate. Optimal drying and curing conditions for the primer composition of the present invention requires subjecting the primer composition to an atmosphere containing at least about 35% relative humidity at ambient temperature for at least about 6.0 hours. Time, temperature and moisture parameters can be easily adjusted by one skilled in the art to provide a dried, cured gamma-aminopropyltrimethoxysilane on the substrate.

Although any conventional coating material may be applied to the substrates after the surface of the substrate has been primed with the gamma-aminopropyltrimethoxysilane dissolved in dimethylacetamide and dried thereon, and there is no intention to limit the invention to any particular coating material, polymerizable coating material, curable coating material, or polymerizable organosiloxane, referred to herein as silicone, in certain preferred embodiments of the present invention, the coating materials are polymerizable materials or curable materials as well-known in the art, and more preferably, in accordance with the present invention, the coating materials are condensation cure silicones which are well-known in the art.

In coating surfaces with the primer composition, the primer composition is simply applied to the surface and permitted to dry and cure. In bonding a coating composition e.g., silicone rubber, to a substrate with the primer composition dried thereon, the primer composition is interposed between the coating composition and the substrate surface to which the coating composition is to be bonded, as by applying the primer composition to the substrate surface. The resulting coated assembly can be any article as set forth in more detail below.

When the coating materials are silicones, it has been found that through the use of the primer composition of the present invention applied to an unabraded, non-porous surface of a substrate, e.g. the surface of a glossy polyimide film, there is an excellent bond formed between the coating composition and the substrate. In addition, the combined materials provide an unusually good bond between the silicones and substrate, the bond strength, measured by peel strength, being greater in magnitude than those provided by similar silanes in DMA or solvents other than DMA or the same silane in solvents other than DMA. The bond strength of the coating material is retained even after subsequent curing, commonly referred to as "oven cure".

The bond strength at the bondline is so great when the primer composition of the present invention is used on the surface of substrates, even on the unabraded surface of substrates, that there is cohesive failure rather than adhesive failure when failure ultimately occurs. Thus, the adhesion developed (or bond formed) by using the primer composition of the present invention, is strong enough that the coating composition exhibits cohesive failure. By using the primer composition of the present invention, especially on a polyimide film surface to promote adhesion of a condensation curable silicone thereto, there is no rupture of the adhesion surface.

The preferred silicone coating compositions which may be used on the primer coating of the present invention, are well-known in the art. They are condensation, room temperature curable, elastomeric organosilicon polymers, that is to say, organo-polysiloxanes, which, in combination with an appropriate curing agent, are converted to the solid, elastic state at room temperature. Heat may be optionally applied to convert the organopolysiloxane to the solid, elastic state as well-known in the art. The organopolysiloxane actually employed in making the coating may be, and preferably is, in the uncured, that is to say, convertible or curable state. Both the cured and uncured forms will be referred to herein as silicone rubber. The silicone rubbers are well-known to those familiar with the art, and the specific silicone rubber employed in accordance with the present invention is not critical and may be selected from any of the well-known varieties, the most preferred silicone rubber being the condensation, room temperature curable organopolysiloxanes. As is conventional, the silicone rubber employed may contain a curing agent or catalyst, such as dibutyl tin dilaurate, tetramethylguanidine, and the like. Conventional filler materials may also be incorporated in the silicone rubber coating composition. Although the preferred silicone rubber compositions are applied to the primed substrate in the form of a paint or a paste, e.g., a liquid or emulsion, pre-formed films or sheet material of silicone rubber can also be adhered to the substrates primed in accordance with the present invention.

Examples of polymerizable organosiloxanes which may be used as coating materials and which may be applied to substrates containing the dried primer compositions of the present invention, include the coating and laminating elastomeric organo-polysiloxane products disclosed in U.S. Pat. No. 3,127,363 which is incorporated by reference herein in its entirety. The self-bonding two-package room temperature vulcanizable silicone rubber compositions of U.S. Pat. No. 3,888,815, which is incorporated by reference herein in its entirety, may also be used as the condensation curable polymerizable organosiloxanes in accordance with the present invention. The room temperature vulcanizable compositions disclosed in U.S. Pat. No. 4,293,597, which is incorporated by reference herein in its entirety, may also be adapted for use as condensation curable polymerizable organosiloxane coating compositions in accordance with the present invention. Conventional solvent and/or dispersion media, application details, mixing and curing methods, additives and adjuvants and the like are well-known in the art and are also discussed in U.S. Pat. Nos. 3,127,363; 3,888,815 and 4,293,597. Commercial coating materials including the condensation curable, polymerizable organosiloxanes (silicones) used in the examples below, are also available for coating substrates in accordance with the present invention.

The primer compositions of the present invention may be applied to a wide variety of porous or non-porous solid bodies or substrates of the type used in making structural fabrications including metal, ceramic, glass (including glass fabric), wood, resins, resin-bonded bodies, rubber, including another silicone rubber body, hydraulic cement, textiles containing synthetic organic fibers, thermoplastic resins, thermoset resins and the like as long as the DMA is not a solvent for the substrate. In most instances, the surfaces to which the silicone rubber is bonded in accordance with the present invention, will be films or sheets, such as those made from synthetic resins or polymers, e.g., the condensation product of dimethyl terephthalate and ethylene glycol (MYLAR ®), polyamide (nylon tape), polyimide (KAPTON ®) and the like. The substrate will be solid (as distinguished from liquid), including a film, abraded or unabraded, not only at room temperature but also at the temperatures employed during the priming, bonding and/or coating operations.

In the most preferred embodiments of the present invention, the substrate is a thermoset resin, e.g., a polyimide film, for example, a polymer derived from pyromellitic dianhydride and an aromatic diamine, as well-known in the art. Preferred polyimide films are about 0.5 to about 5 mils in thickness marketed by E. I. duPont under the name KAPTON ® or marketed by Allied-Apical Company under the name APICAL ®. In accordance with the present invention, the polyimide film may be abraded or unabraded, and the primer composition of the present invention forms an excellent bond with either the unabraded or the abraded polyimide film. In accordance with the present invention, there is also provided a method of bonding polymerizable condensation cure silicones to a thermoset resin substrate, for example, polyimide film, comprising applying a solution of gamma-aminopropyltrimethoxysilane in dimethylacetamide solvent to the thermoset resin substrate, drying the thermoset resin to evaporate the solvent and curing the gamma-aminopropyltrimethoxysilane.

As discussed above, the substrates which are coated with the primer composition of the present invention, may be abraded or unabraded. However, in accordance with the present invention, it has been found that the polymeric substrates, for example, polyimide film, forms an excellent bond with the silane/DMA primer composition of the present invention without any abrasion, that is, in an unabraded form. In accordance with the present invention, it has been found that there is an excellent bond formed with the silane primer composition of the present invention when the polyimide film has a high gloss, unabraded, non-porous surface. As discussed above, it is within the purview of one skilled in the art to form abraded surfaces to which the primer composition of the present invention may be applied. Conventional techniques may be used for providing abraded surfaces, for example, by blasting the surface with conventional material such as grit, sand, or the like or by using chemical etching, plasma etching, sanding or rubbing techniques or any other technique which forms surface irregularities sufficient to provide a roughened surface.

The primer composition may be applied to the substrate surface of any article of any configuration. The article may comprise a substrate of a solid body or a film as discussed above. The article can also be in the form of a laminate, one or more surfaces of which are coated with the primer composition by the method of the present invention. In a preferred embodiment of the present invention, the article comprises a thermoset resin substrate, for example, a polyimide resin in the form of an abraded or unabraded polyimide film, and a gamma-aminopropyltrimethoxysilane adhesion promoter, the gamma-aminopropyltrimethoxysilane adhesion promoter having been applied to the substrate by wetting the substrate with a solution of gamma-aminopropyltrimethoxysilane in dimethylacetamide and then drying the substrate. Examples of articles which may be made with the primer composition of the present invention include a substrate for a solar array, a substrate for a quadrifilar antenna, a substrate for flexible circuitry, all of which are substrates well-known in the art, and the like.

The primer is generally applied in a thickness sufficient to improve the acceptability of the primed surface for additional coating materials. Generally, the primer composition, after drying and curing, on the surface of the substrate is less than about 1.0 mil. Thicknesses of 1.0 mil or greater have a tendency to crack or flake off. Furthermore, if the primer is too thick, e.g., greater than about 1.0 mil, the adhesion between the coating material and substrate would be reduced. Thus, it is disadvantageous to apply a thickness of primer any greater than about 1.0 mil to a substrate. In preferred embodiments the thickness of the primer is thin enough that it cannot be measured with mechanical means, it being only present in a few monolayers at most, e.g., less than about 1.0 micron.

As used herein, in its broadest sense, any coating material which will bond to the primed substrate, may be used to coat the articles of the present invention. However, in accordance with the present invention, the preferred coating materials are those silicone rubbers which will bond to the primed substrate, and the most preferred coating materials are the condensation curable silicones which may also be defined as room temperature vulcanizable silicone rubbers, room temperature vulcanizable polyorganosiloxanes, and the like, all of which are well-defined in the prior art.

The present invention will be more clearly understood from a consideration of the following specific examples which are given for the purpose of illustration only and are not intended to limit the scope of the invention in any way.

EXAMPLES

Silanes having reactive groups thereon which appeared to have sufficient reactivity or functionality to bond to a polyimide surface were evaluated by applying the neat silanes to polyimide surfaces to examine them for wetting angle and uniformity of spread or coverage on polyimide surfaces as well as for speed of cure, film adhesion and flexibility. Silanes having the following reactive groups were tested: silanes having reactive aliphatic amine groups, silanes having reactive polyamine groups, silanes having reactive vinyl benzyl amine groups, silanes having reactive quaternary amine groups, silanes having reactive amino propenyl groups, silanes having reactive mercaptan groups, silanes having reactive carboxyamide groups and silanes having reactive chloroaromatic groups.

Specific primers preliminarily screened for wetting angle, uniformity of spread or coverage on polyimide surfaces and ability to cure, as discussed above, included: N-2-aminoethyl-3-aminopropyltrimethoxysilane, aminopropyltriethoxysilane, Prosil-9215, a proprietary carboxyamide, bis[3-(triethoxysilyl)-propyl]tetrasufide-3-mercapto, 2(diphenylphosphino)ethyl triethoxysilane, N-vinylbenzyl-N-2(trimethoxysilylpropylamino)ethyl silane, trimethoxysilylpropyl-diethylenetriamine, 3-aminopropylmethyldiethoxysilane, 3-(1-aminopropoxy)-3-3-dimethyl-1-propenyl-trimethoxysilane, 1-trimethoxysilyl-2-(m,p-chloromethyl)-phenylethane, and trimethoxysilylpropyl-substituted polyethylene-imine.

Primers of some of the foregoing silanes which passed the preliminary screening tests, were prepared by dissolving the particular silane listed above in isopropanol at a concentration of 2% by weight of the particular silane based on the total weight of the silane and isopropanol. The primer composition was applied to mechanically-abraded bulk polyimide surfaces by wiping, and the primer was allowed to cure at room temperature over night (approximately 18 hours). After approximately 18 hours, the surfaces were painted (by wiping) with a black silicone paint obtained from Illinois Institute of Technology Research Institute under the designation MH2IS. The paint was a condensation cure silicone.

Cross hatch adhesion testing using ASTM 3359 Type B was carried out before and after exposure of the samples to heat, namely, samples cured at room temperature and samples heated at about 100° C.

As a result of the foregoing tests, it was found that gamma-aminopropyltrimethoxysilane (AMMO) primer bonded the black silane paint best, even substantially better than N,beta-aminoethyl-gamma-aminopropyltrimethoxysilane primer.

It was also found that the bonding of the black silicone paint to the mechanically abraded polyimide surface with gamma-aminopropyltrimethoxysilane (AMMO) primer was superior to gamma-aminopropyltriethoxysilane and to prehydrolyzed gamma-aminopropyltrimethoxysilane primer.

Peel tests also demonstrated that a 5% by weight solution of gamma-aminopropyltrimethoxysilane dissolved in isopropanol adequately primed abraded polyimide, but it did not pass the peel test when it was used as the primer on unabraded, unetched polyimide film wiped with the primer and allowed to cure overnight (about 18 hours) after which a condensation cure silicone rubber identified as McGhan NuSil CV-2566 silicone was applied thereto. The results are shown in the comparison information set forth in the table below.

The gamma-aminopropyltrimethoxysilane was dissolved in various solvents shown in the table below including dimethylsulfoxide, dimethylformamide and N-methylpyrrolidone. A primer formulated with the AMMO and dimethylsulfoxide and a primer formulated with AMMO and dimethylformamide failed as a primer because it did not properly wet the surface of the polyimide (KAPTON ®) film. A primer composition formulated by dissolving 5% by weight AMMO in N-methylpyrrolidone had adhesive failure (0 oz./in width).

When primer formulated with 5% by weight AMMO in dimethylacetamide failed, it was a cohesive failure at a Peel Test of 27 oz/in. width when coated with the coating material identified above, namely, McGhan-NuSil CV-2566 silicone.

TABLE I

EFFECT OF PRIMER COMPOSITIONS ON ADHESION OF CONDENSATION CURE SILICONE COATING TO POLYIMIDE FILM SUBSTRATE

| PRIMER | POLYIMIDE FILM | |
|---|---|---|
| | ABRADED | UNABRADED |
| 5% AMMO/DMA | Passed[1] | Passed[1] |
| 5% AMMO/Isopropanol | Passed | Failed[2] |
| 5% AMMO/N-methylpyrrolidone | X | Failed[3] |
| 5% AMMO/Dimethylsulfoxide | X | Failed[4] |
| 5% AMMO/Dimethylformamide | X | Failed[4] |

X = Not Tested
[1]Passed the Peel Test of 27 oz/in. width (cohesive failure).
[2]Failed the Peel Test, i.e., peeled at 10 oz/in. width (adhesive failure).
[3]Peel Test - 0 oz./in. width.
[4]Wet suboptimally.

The peel test was a standard ASTM test identified as ASTM D 1876. This is generally described as a T-peel test. A sample was considered as passing the test in accordance with the present invention if it withstood a T-peel of 10 oz./in. width. The test is conducted by using two pieces of film, in the instance case, KAPTON ® polyimide film, each piece being 12 inches long. The first 9 inches are coated, in the instant case by wiping with a soft cloth, with a primer composition. The last 3 inches of the 1 inch wide strip of film was not primed. After application of the coating material, in this case the McGhan NuSil CV-2566 condensation cure silicone, and curing at room temperature for 18 hours, the strip was placed in the jaws of a tensile tester and peeled from the polyimide film. The amount of force required to separate the two pieces of film was measured in oz./in. width. It was noted by visual examination of the peeled strips if the sample failed adhesively or cohesively.

Three different adhesion tests were performed on samples of reinforced black KAPTON ® polyimide film primed with a 5% AMMO/DMA primer composition as discussed above and shown in TABLE I above. The coating material was a condensation cure white silicone paint designated as S13-G/LO. In all three cases (as seen in TABLE II below) the performance of the AMMO/DMA primer system was excellent. The three different tests are enumerated and explained below:

Test #1 was performed in accordance with the procedure described in ASTM D 3359-87, Test Method B, with the exception that the painted surface was not cut.

Test #2 was conducted in accordance with ASTM D 3359-87, Test Method B, Standard Test Methods for Measuring Adhesion by Tape Test. A 3M Tape 8403 was used in adhesion test numbers 1 and 2. This is a polyester-backed tape with a silicone base adhesive. The manufacturer reports an adhesion strength of 18 oz./in. width for this tape. It should be noted that this tape does not fully comply with the ASTM D 3359-87 tape adhesion requirement of 40 oz./in. width, however, the suggested tape has an acrylic base adhesive which does not adhere to the white silicone-based S13 G/LO paint.

Test #3 is a thermal shock method used by Illinois Institute of Technology & Research Institute. A painted membrane (film) specimen measuring 4 inches by 2 inches is immersed in liquid nitrogen until equilibrium is reached (rapid bubbling stops). The sample is removed and allowed to return to room temperature. Removal of the paint is attempted via scraping with a blunt implement. Excessive peeling of the paint is the criteria for failure. Chipping or flaking of the paint does not constitute failure.

TABLE II

VARIOUS SILICONE PAINT ADHESION TESTS ON POLYIMIDE FILM SUBSTRATES PRIMED WITH AMMO/DMA PRIMER

| Test Number | Results |
|---|---|
| 1 | No paint removed. |
| 2 | 4B Adhesion Classification per ASTM D 3359-87. Small flakes of the coating are detected at intersections; less than 5% of the area is effected. |
| 3 | Paint can not be removed unless physically gouged from the surface. |

COMPARATIVE TESTING

DuPont black KAPTON ® polyimide film containing 9% carbon was epoxied to an aluminum paint coupon, primed with pure aminopropyltrimethoxysilane (containing no solvent) and painted with S13-G/LO white silicone paint. It failed the ASTM D 1737 mandrel bend test for a 3/16 inch mandrel.

A test carried out as above under the same conditions with 5% aminopropyltrimethoxysilane in DMA passed.

A drop of aminopropyltrimethoxysilane (no solvent) was placed on natural KAPTON ®, and it spread to 3/8 inch diameter. A drop of 5% aminopropyltrimethoxysilane in DMA was placed on natural KAPTON ®, and it spread to 1¼ inches in diameter, showing superior wetting.

From the foregoing tables and from the foregoing information, it is clear that the primer composition made from AMMO dissolved in dimethylacetamide (DMA) was superior to all of the other primer compositions tested.

While other modifications of the invention and variations thereof which may be employed within the scope of the invention have not been described, the invention is intended to include such modifications as may be embraced within the following claims.

What is claimed is:

1. A primer composition consisting essentially of gamma-aminopropyltrimethoxysilane dissolved in an aprotic solvent having a solubility parameter of about 10.8 $(cal/cm^3)^{\frac{1}{2}}$.

2. The primer composition of claim 1 consisting essentially of gamma-aminopropyltrimethoxysilane dissolved in N,N'-dimethylacetamide.

3. The composition of claim 2 consisting essentially of about 0.1% to about 49% by weight gamma-aminopropyltrimethoxysilane in N,N'-dimethylacetamide, percent by weight being based on the total weight of the composition.

4. The composition of claim 2 consisting essentially of about 1.0% to about 10% by weight gamma-aminopropyltrimethoxysilane in N,N'-dimethylacetamide, percent by weight being based on the total weight of the composition.

5. A method for priming a surface to improve bonding of a coating material thereto, comprising wetting the surface with a solution of gamma-aminopropyltrimethoxysilane in an aprotic solvent having a solubility parameter of about 10.8 $(cal/cm^3)^{\frac{1}{2}}$ prior to applying a coating material to the surface and thereafter drying the surface to remove the aprotic solvent and curing the gamma-aminopropyltrimethoxysilane.

6. The method of claim 5 for priming a surface to improve its bonding to a coating material, comprising wetting the surface with a solution of gamma-aminopropyltrimethoxysilane in N,N'-dimethylacetamide.

7. The method of claim 6 wherein the solution contains about 0.1% to about 49% by weight, based on the total weight of the composition, of gamma-aminopropyltrimethoxysilane.

8. The method of claim 6 wherein the solution contains about 1.0% to about 10% by weight, based on the total weight of the composition, of gamma-aminopropyltrimethoxysilane.

9. The method of claim 6, wherein the coating material is a condensation cure silicone, and the silicone is cured after applying the coating material to the surface.

10. A method of bonding condensation cure silicone to a resin substrate comprising applying a solution of gamma-aminopropyltrimethoxysilane in an aprotic solvent having a solubility parameter of about 10.8 $(cal/cm^3)^{\frac{1}{2}}$ to the resin substrate; drying the resin substrate to remove the aprotic solvent; curing the gamma-aminopropyltrimethoxysilane; applying the condensation cure silicone to the resin substrate; and curing the silicone.

11. The method of claim 10 of bonding condensation cure silicone to a resin substrate comprising applying a solution of gamma-aminopropyltrimethoxysilane in N,N'-dimethylacetamide to the resin substrate.

12. The method of claim 11 wherein the solution contains about 0.1% to about 49% by weight based on the total weight of the composition, of gamma-aminopropyltrimethoxysilane.

13. The method of claim 11 wherein the solution contains about 1% to about 10% by weight based on the total weight of the composition, of gamma-aminopropyltrimethoxysilane.

14. The method of claim 11, wherein the resin substrate is a polyimide.

15. The method of claim 11 wherein the resin substrate is an unabraded polyimide film.

16. A coated substrate formed by the method of claim 11.

17. An article prepared from the substrate of claim 16.

18. The article of claim 17 in the form of a substrate for a solar array.

19. The article of claim 17 in the form of a substrate for a quadrifilar antenna.

20. The article of claim 17 in the form of a substrate for flexible circuitry.

21. A coated substrate formed by the method of claim 14.

22. An article prepared from the substrate of claim 21.

23. The article of claim 22 in the form of a substrate for a solar array.

24. The article of claim 22 in the form of a substrate for a quadrifilar antenna.

25. The article of claim 22 in the form of a substrate for flexible circuitry.

* * * * *